(12) United States Patent
Majercak

(10) Patent No.: US 8,610,335 B1
(45) Date of Patent: Dec. 17, 2013

(54) ELECTRICITY PRODUCING TIRE

(76) Inventor: Andrej Majercak, Brooklyn, NY (US)

( * ) Notice: Subject to any disclaimer, the term of this patent is extended or adjusted under 35 U.S.C. 154(b) by 272 days.

(21) Appl. No.: 13/134,116

(22) Filed: May 31, 2011

(51) Int. Cl.
*H01L 41/113* (2006.01)

(52) U.S. Cl.
CPC .................................. *H01L 41/113* (2013.01)
USPC ........................................................ 310/339

(58) Field of Classification Search
CPC .............. H01L 41/113; H01L 41/1132; H01L 41/1134; H01L 41/1136; H01L 41/1138
USPC ........................................................ 310/339
See application file for complete search history.

(56) References Cited

U.S. PATENT DOCUMENTS

| | | | |
|---|---|---|---|
| 2005/0110277 A1* | 5/2005 | Adamson et al. | 290/1 R |
| 2007/0063621 A1* | 3/2007 | Haswell et al. | 310/339 |

\* cited by examiner

*Primary Examiner* — Derek Rosenau

(57) ABSTRACT

An electricity producing tire for generating electrical current from the rotation and compression of the tire as a vehicle moves. The device includes a wheel rim and a tire. The tire is coupled to the wheel rim forming an interior space. An annular housing is positioned in the interior space. The housing has an annular outer wall, an annular inner wall and opposing side walls. A piezoelectric transducer is positioned in the interior space such that compression of the tread as the tire rotates compresses the transducer to produce electrical current. A power cable is operationally coupled to the transducer for transmitting the electrical current through the power cable.

9 Claims, 4 Drawing Sheets

ELECTRICITY PRODUCING TIRE

BACKGROUND OF THE DISCLOSURE

Field of the Disclosure

The disclosure relates to vehicle tire devices and more particularly pertains to a new vehicle tire device for generating electrical current from the rotation and compression of the tire as a vehicle moves.

SUMMARY OF THE DISCLOSURE

An embodiment of the disclosure meets the needs presented above by generally comprising a wheel rim and a tire having a tread and opposing sidewalls extending from the tread. The tire is coupled to the wheel rim forming an interior space between the tire and the wheel rim. An annular housing is positioned in the interior space between the tire and the wheel rim. The housing has an annular outer wall, an annular inner wall and opposing side walls extending between the outer wall and the inner wall. A plurality of piezoelectric transducers extends outward radially from the outer wall of the housing. Each transducer has a base portion and a compressible distal portion relative to the housing. The distal portion of the transducer extends from the base portion when in an uncompressed state. Each distal portion of each transducer is positioned in the interior space in spaced relationship to the tread such that compression of the tread as the tire rotates compresses the distal portion of the transducer into the base portion of the transducer to produce electrical current. A power cable has a first end extending into the housing. The power cable is operationally coupled to each transducer for transmitting the electrical current through the power cable.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
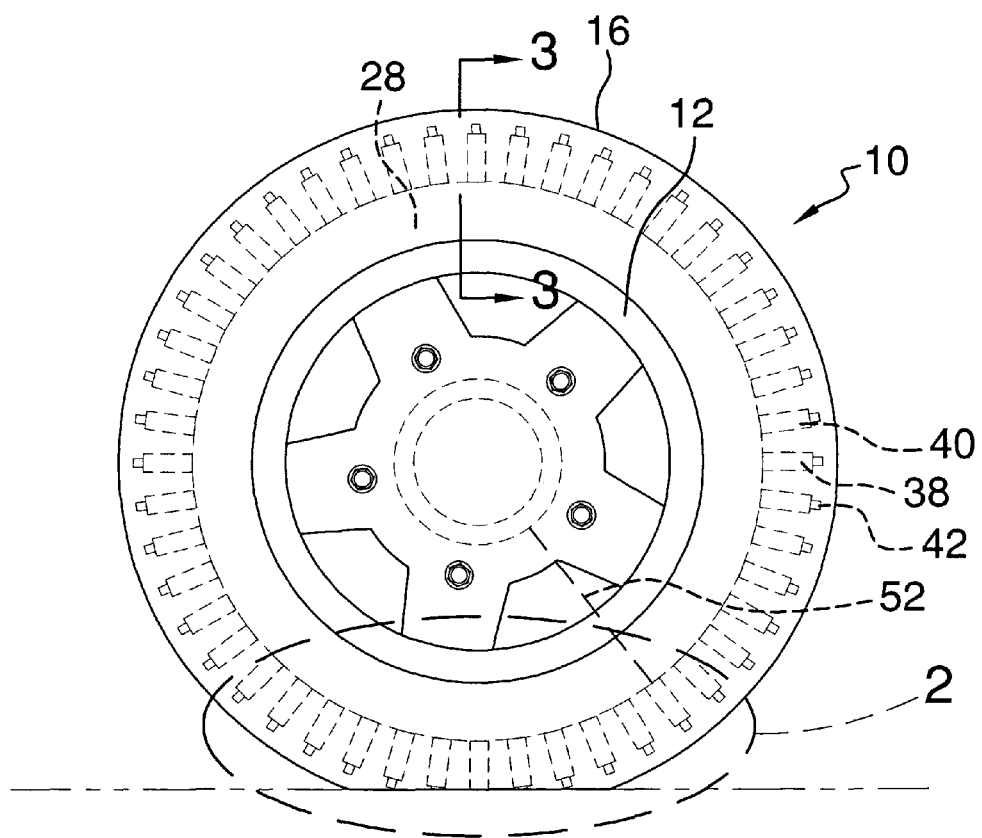
FIG. 1 is a side view of an electricity producing tire according to an embodiment of the disclosure.
Figure 2:
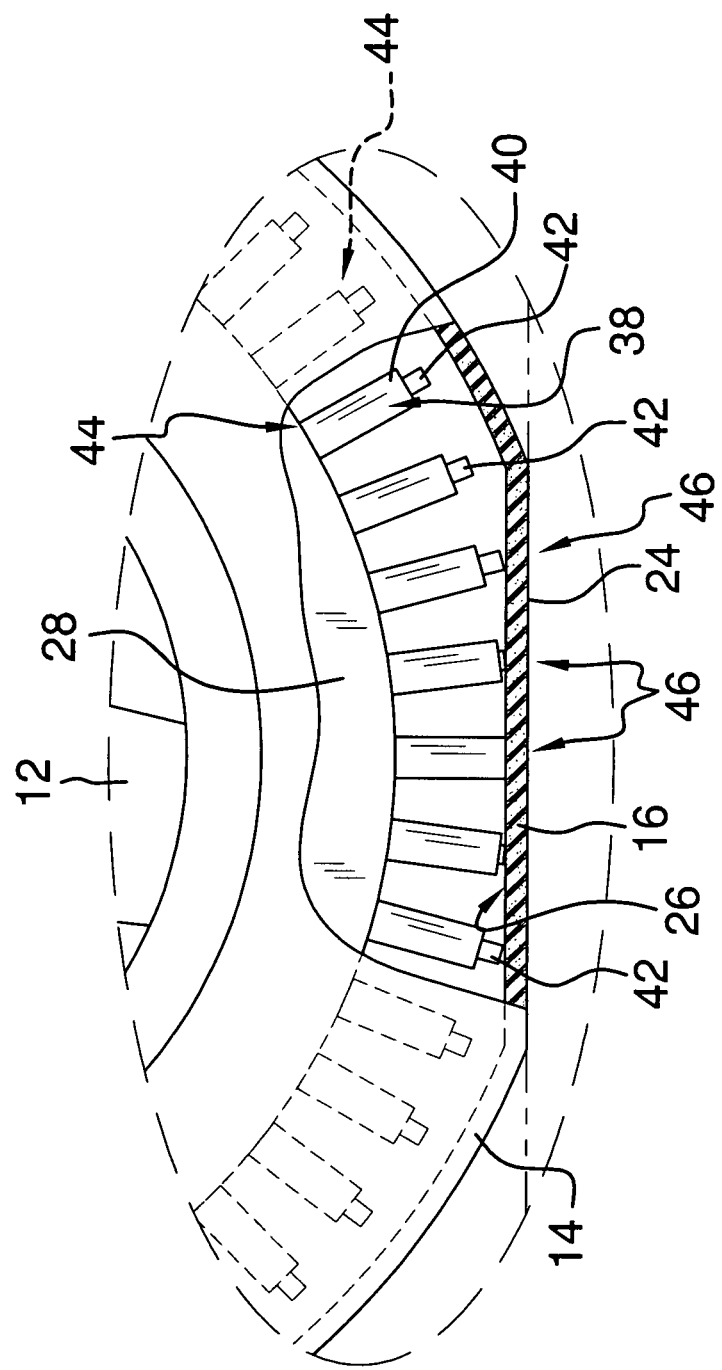
FIG. 2 is a partial cut-away side view of an embodiment of the disclosure.
Figure 4:
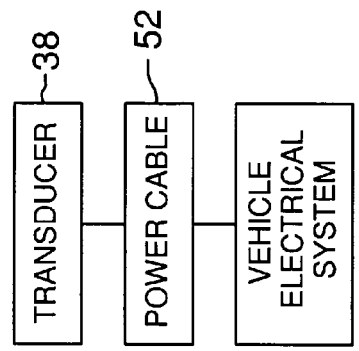
FIG. 4 is a schematic diagram of an embodiment of the disclosure.
Figure 3:
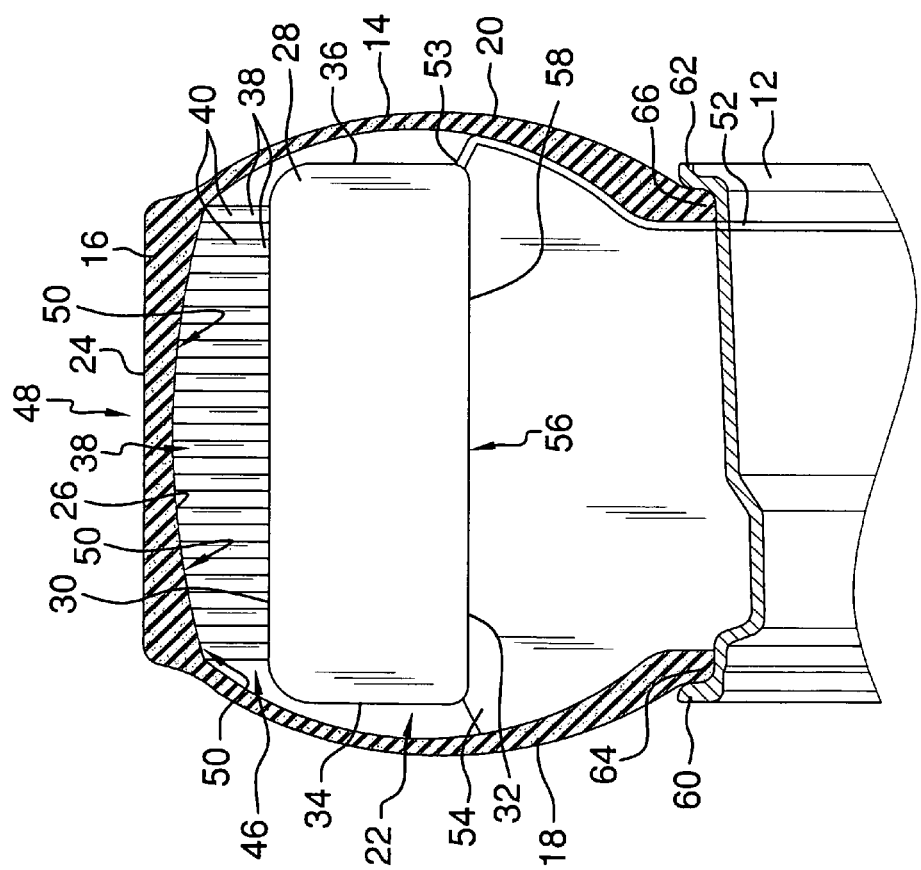
FIG. 3 is a cross-sectional view of an embodiment of the disclosure taken along line 3-3 of FIG. 1.
Figure 5:
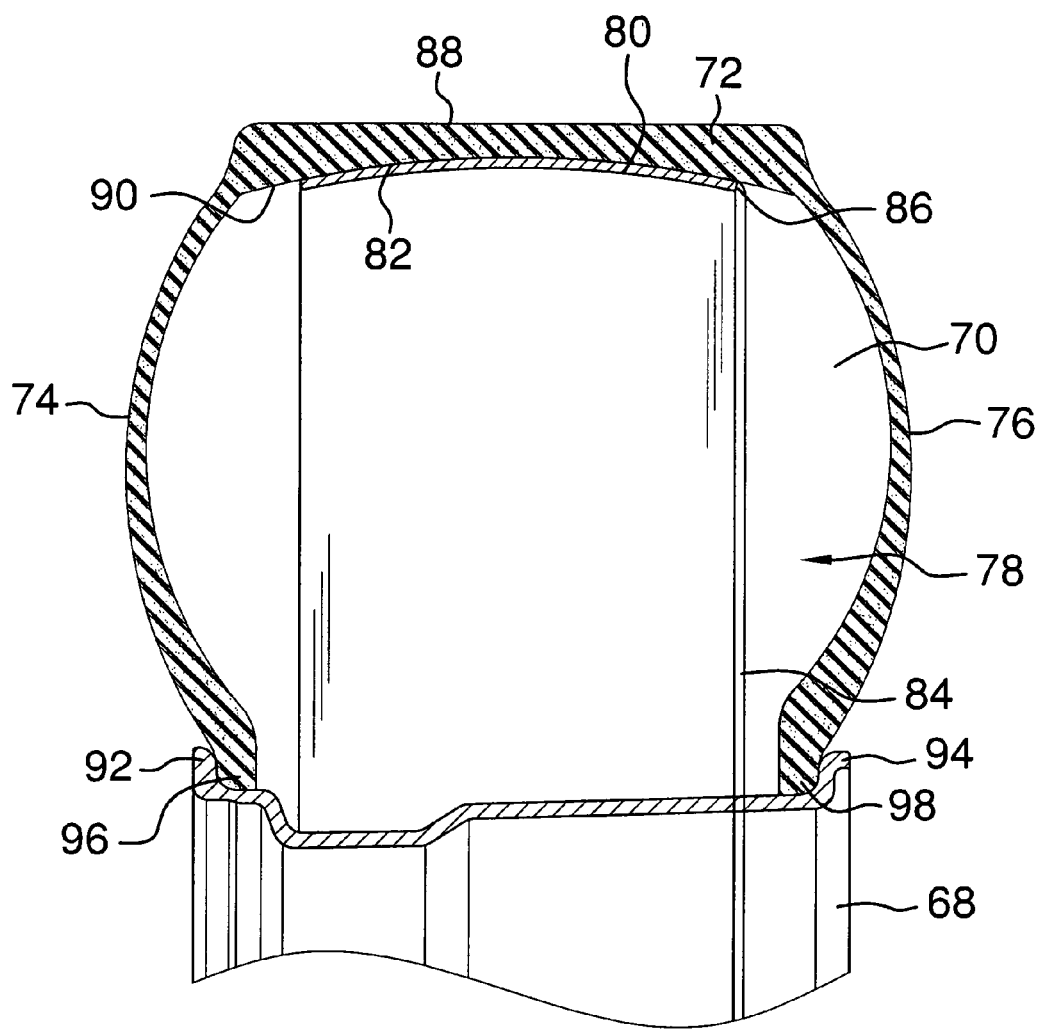
FIG. 5 is a cross-sectional view of an alternate embodiment of the disclosure.

With reference now to the drawings, and in particular to FIGS. 1 through 5 thereof, a new vehicle tire device embodying the principles and concepts of an embodiment of the disclosure and generally designated by the reference numeral 10 will be described.

As best illustrated in FIGS. 1 through 5, the electricity producing tire 10 generally comprises a wheel rim 12 and a tire 14 having a tread 16 and opposing sidewalls 18,20 extending from the tread 16. The side walls 18,20 of the tire 14 taper extending from the wheel rim 12 towards the tread 16 of the tire 14. The tire 14 is coupled to the wheel rim 12 forming an interior space 22 between the tire 14 and the wheel rim 12. The tread 16 has a planar outer surface 24 and a curved inner surface 26 transverse to a direction of rotation of the tire 14. An annular housing 28 is positioned in the interior space 22 between the tire 14 and the wheel rim 12. The housing 28 has an annular outer wall 30, an annular inner wall 32 and opposing side walls 34,36 extending between the outer wall 30 and the inner wall 32. A plurality of piezoelectric transducers 38 extends outward radially from the outer wall 30 of the housing 28. Each transducer 38 has a base portion 40 and a compressible distal portion 42 relative to the housing 28. The distal portion 40 of the transducer 38 extends from the base portion 40 when in an uncompressed state 44. Each distal portion 42 of each transducer 38 is positioned in the interior space 22 in spaced relationship to the tread 16 such that compression of the tread 16 as the tire 14 rotates compresses the distal portion 42 of the transducer 38 into the base portion 40 of the transducer 38. Thus, the transducer 38 produces electrical current. The transducers 38 may be arranged into a plurality of rows 46. Each row 46 extends across the outer surface 30 of the housing 28 between the opposing sides 34,36. The base portions 40 of each transducer 38 within each row 46 decreases in length from a center 48 of each row 46 towards the outermost transducer 38 in each row 46. Thus, outermost surfaces 50 of the base portions 40 of the transducers 38 in each row 46 are positioned against the curved inner surface 26 of the tread 16 when the tread 16 is deflected inwardly towards the wheel rim 12. A power cable 52 has a first end 53 extending into the housing 28. The power cable 52 is operationally coupled to each transducer 38 for transmitting the electrical current through the power cable 52.

An air bladder 54 may be positioned between the housing 28 and the wheel rim 12. The housing 28 may be coupled to the air bladder 54. A medial portion 56 of an interior surface 58 of the air bladder 54 is coupled to the housing 28. Thus, the side walls 34,36 of the housing 28 are supported in spaced relationship to the side walls 18,20 of the tire 14. Opposing lips 60,62 extend from the wheel rim 12. Edge portions 64,66 of the tire 14 extend from the side walls 18,20 of the tire 14. Each edge portion 64,66 engages an associated one of the lips 60,62. Thus, the tire 14 is coupled to the wheel rim 12.

An alternate embodiment of the disclosure provides a wheel rim 68 and a tire 70 having a tread 72 and opposing sidewalls 74,76 extending from the tread 72. The sidewalls 74,76 are coupled to the wheel rim 68 forming an interior space 78 between the tire 70 and the wheel rim 68. A piezoelectric transducer foil 80 is coupled to an interior surface 82 of the tire 70 such that deflection of the tread 72 urges the transducer foil 80 to deflect producing electrical current. A power cable 84 has a first end 86 operationally coupled to the transducer foil 80 for transmitting the electrical current through the power cable 84. The tread 72 has a planar outer surface 88 and an inner surface 90 is curved transverse to a direction of rotation of the tire 70. The side walls 74,76 of the tire 70 taper extending from the wheel rim 68 towards the tread 72 of the tire 70. The wheel rim 68 has opposing lips 92,94. The tire 70 has edge portions 96,98 extending from the side walls 74,76 of the tire 70. Each edge portion 96,98 engages an associated one of the lips 92,94. Thus, the tire 70 is coupled to the wheel rim 68.

In use, the tire 14,70 is attached to the wheel rim 12,68 which in turn is attached to a vehicle. As the tire 14,70 rotates, the tread 16,72 deflects. The deflection causes the transducer 38 or 80 to produce an electrical current. The power cable 52 or 84 collects the electrical current for use to recharge a battery of the vehicle, run additional electrical systems in the vehicle, or to otherwise increase the efficiency of the vehicle.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure.

I claim:

1. An electricity generating tire assembly comprising:
   a wheel rim;
   a tire having a tread and opposing sidewalls extending from said tread, said tire being coupled to said wheel rim forming an interior space between said tire and said wheel rim;
   an annular housing positioned in said interior space between said tire and said wheel rim, said housing having an annular outer wall, an annular inner wall and opposing side walls extending between said outer wall and said inner wall;
   a plurality of piezoelectric transducers extending outward radially from said outer wall of said housing, each said transducer having a base portion and a compressible distal portion relative to said housing, said distal portion of said transducer extending from said base portion when in an uncompressed state, each distal portion of each said transducer being positioned in said interior space in spaced relationship to said tread such that compression of said tread as said tire rotates compresses said distal portion of said transducer into said base portion of said transducer whereby said transducer produces electrical current; and
   a power cable having a first end extending into said housing, said power cable being operationally coupled to each said transducer for transmitting said electrical current through said power cable.

2. The assembly of claim 1, further including said tread having a planar outer surface and a curved inner surface transverse to a direction of rotation of said tire.

3. The assembly of claim 2, further including said transducers being arranged into a plurality of rows, each said row extending across said outer surface of said housing between said opposing sides.

4. The assembly of claim 3, wherein said base portions of each said transducer within each said row decrease in length from a center of each said row towards said outermost transducer in each said row whereby outermost surfaces of said base portions of said transducers in each said row are positioned against said curved inner surface of said tread when said tread is deflected inwardly towards said wheel rim.

5. The assembly of claim 1, further including an air bladder positioned between said housing and said wheel rim, said housing being coupled to said air bladder.

6. The assembly of claim 5, wherein said housing is coupled to a medial portion of an interior surface of said air bladder whereby said side walls of said housing are supported in spaced relationship to said side walls of said tire.

7. The assembly of claim 1, wherein said side walls of said tire taper extending from said wheel rim towards said tread of said tire.

8. The assembly of claim 1, further comprising:
   said wheel rim having opposing lips; and
   said tire having edge portions extending from said side walls of said tire, each said edge portion engaging an associated one of said lips whereby said tire is coupled to said wheel rim.

9. An electricity generating tire assembly comprising:
   a wheel rim;
   a tire having a tread and opposing sidewalls extending from said tread, said side walls of said tire tapering extending from said wheel rim towards said tread of said tire, said tire being coupled to said wheel rim forming an interior space between said tire and said wheel rim, said tread having a planar outer surface and a curved inner surface transverse to a direction of rotation of said tire;
   an annular housing positioned in said interior space between said tire and said wheel rim, said housing having an annular outer wall, an annular inner wall and opposing side walls extending between said outer wall and said inner wall;
   a plurality of piezoelectric transducers extending outward radially from said outer wall of said housing, each said transducer having a base portion and a compressible distal portion relative to said housing, said distal portion of said transducer extending from said base portion when in an uncompressed state, each distal portion of each said transducer being positioned in said interior space in spaced relationship to said tread such that compression of said tread as said tire rotates compresses said distal portion of said transducer into said base portion of said transducer whereby said transducer produces electrical current, said transducers being arranged into a plurality of rows, each said row extending across said outer surface of said housing between said opposing sides, said base portions of each said transducer within each said row decrease in length from a center of each said row towards said outermost transducer in each said row whereby outermost surfaces of said base portions of said transducers in each said row are positioned against said curved inner surface of said tread when said tread is deflected inwardly towards said wheel rim;
   a power cable having a first end extending into said housing, said power cable being operationally coupled to each said transducer for transmitting said electrical current through said power cable;
   an air bladder positioned between said housing and said wheel rim, said housing being coupled to said air bladder;
   a medial portion of an interior surface of said air bladder being coupled to said housing whereby said side walls of said housing are supported in spaced relationship to said side walls of said tire;
   opposing lips extending from said wheel rim; and
   edge portions of said tire extending from said side walls of said tire, each said edge portion engaging an associated one of said lips whereby said tire is coupled to said wheel rim.

* * * * *